US006683359B2

United States Patent
Johnson et al.

(10) Patent No.: US 6,683,359 B2
(45) Date of Patent: Jan. 27, 2004

(54) HALL EFFECT DEVICE WITH MULTIPLE LAYERS

(75) Inventors: Mark B. Johnson, Springfield, VA (US); Gary A. Prinz, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/176,002

(22) Filed: Jun. 21, 2002

(65) Prior Publication Data

US 2003/0234429 A1 Dec. 25, 2003

(51) Int. Cl.⁷ ............................................... H01L 29/82
(52) U.S. Cl. .................. 257/421; 257/422; 257/423; 257/424; 257/425
(58) Field of Search ......................... 257/421, 422–425

(56) References Cited

U.S. PATENT DOCUMENTS

| 5,561,368 | A | * | 10/1996 | Dovek et al. | ............ | 324/252 |
| 5,652,445 | A | | 7/1997 | Johnson | | |
| 6,064,083 | A | | 5/2000 | Johnson | | |
| 6,403,999 | B1 | * | 6/2002 | O'Handley et al. | ......... | 257/295 |
| 6,452,239 | B1 | * | 9/2002 | McDowell et al. | ......... | 257/421 |

FOREIGN PATENT DOCUMENTS

JP  2000-306376  * 11/2000  ........... H01L/43/08

OTHER PUBLICATIONS

Zelakiewicz et al, "Three Terminal Gated Magnetoelectronic Device" Naval Research Laboratory, Washington D.C., pp. 1–10.

Johnson et al, "Hybrid Ferromagnet–Semiconductor Nonvolatile Gate", IEEE Transactions On Magnetics, vol. 34, No. 4, Jul. 1998, pp. 1054–1059.

Chen, "Magnetism and the Metallurgy of Soft Magnetic Materials", Dover Publications, New York, 1986, p. 208.

* cited by examiner

Primary Examiner—Jasmine Clark
(74) Attorney, Agent, or Firm—John J. Karasek; Stephen T. Hunnius

(57) ABSTRACT

A Hall effect device comprising: (a) an electrically-conductive layer or plate having a top surface: and (b) a ferromagnetic multilayer, where the conductive film or layer is composed of high mobility semiconductors. Also, a Hall effect device can be a device in which the Hall plate comprises an indium compound, germanium or mixtures thereof. The devices are useful for a variety of applications such as a memory element in a nonvolatile random access memory array (NRAM) and as a logic gate.

32 Claims, 3 Drawing Sheets

CROSS-SECTION

TOP VIEW

HALL EFFECT DEVICE WITH MULTIPLE LAYERS

BACKGROUND OF THE INVENTION

1. Field of the Invention

The present invention relates generally to a Hall effect device. In particular, the present invention relates to a hybrid Hall effect device (i.e., a magneto-electronic device) comprising a semiconductor structure and a ferromagnetic element or multilayer. The devices according to the present invention are useful for various applications including, but not limited to, nonvolatile random access memory array (NRAM), use as a logic gate, field effect transistor (FET), and any other sensing element in the category of Hall effect devices.

2. Description of the Background Art

The semiconductor field effect transistor (FET), typically fabricated as a metal oxide semiconductor (MOSFET) structure on a silicon substrate or gallium arsenide device (GaAsFET) on a gallium arsenide substrate, is the building block of modern digital electronics. For example, memory cells for the storage of binary information and logic gates for the processing of digital data streams both use FET's as the primary components.

A standard representation for a classic four-terminal Hall plate is a cross centered in a square. Two opposing terminals on two opposing sides of the square are used for current bias/+ and/− (or voltage bias), and two other opposing terminals on the remaining two opposing sides are used as sensing probes for sensing a bipolar Hall voltage (or current).

Recently, certain modified Hall effect devices (i.e., a hybrid combination of a conventional Hall plate coupled to a ferromagnetic layer) have been disclosed. A modified Hall plate incorporates a ferromagnetic film that is usually fabricated to be electrically isolated from the Hall plate (e.g., by an insulating layer) but to cover a portion of the. area of the Hall plate such that an edge of the ferromagnetic film is over a central region of the plate. Local, fringe magnetic fields from the edge of the ferromagnetic film are perpendicular to the plane of the plate, may point "up" or "down" depending on the orientation of the magnetization of the ferromagnetic film, and have an average value $B_{av}$ in the active region of the device. For constant bias current the sensed Hall voltage (or current) has opposite polarity when the fringe fields are "up" compared with when they are "down." The magnetization of the ferromagnetic film is typically in the plane of the ferromagnetic film and lies along an axis parallel with that of the bias current, but it is also possible to use a magnetic material with magnetization perpendicular to the plane. In the former case, the magnetization can have two stable states along the axis parallel with the bias current and each state corresponds to "up" or "down" fringe fields near the edge of the ferromagnetic film, positive or negative Hall voltage (or current), and a binary bit of information "1" or "0". The magnetization state can be set (written) to be positive or negative by using the magnetic field associated with a positive or negative current pulse transmitted down an integrated write wire that is contiguous with the ferromagnetic film, as in U.S. Pat. No. 5,652,445 ('445) to Johnson, which is incorporated herein by reference for all purposes. It follows that such a device can be used as the nonvolatile storage element in an array of elements comprising a nonvolatile random access memory (NRAM).

The '445 patent involves an application in high density nonvolatile memory and logic gate environments. The '445 patent involves a conductive film layer, a ferromagnetic layer, a fringe magnetic field, and an electrical signal. Reference is also made to the '445 patent for further discussion of the Hall effect and other Hall effect devices.

The need exists to provide new, modified Hall effect devices with further enhancements. In particular, there is a significant need in the art for improved hybrid Hall effect devices that are more reliable for use in high density memory and logic environments than existing hybrid Hall effect devices.

SUMMARY OF THE INVENTION

Accordingly, it is an object of the present invention to provide a significantly improved hybrid Hall effect device that exhibits increased reliability in high density memory and logic environments.

It is also an object of the present invention to present novel materials systems to be used in the fabrication of hybrid Hall effect devices, with the effect of enhancing the operating speed and increasing the output signal level of the device.

It is another object of the present invention to provide a substantially improved hybrid Hall effect device in which the remanence of the magnetic component layer is larger and therefore the bistable output voltage (or current) is larger.

It is yet another object of the present invention to achieve a further improvement over existing hybrid Hall effect devices by providing devices with a square hysteresis loop of the ferromagnetic component, thereby improving the efficiency of the write process.

It is a further object of the present invention to achieve an improvement over existing hybrid Hall effect devices by providing devices with a lower coercivity of the ferromagnetic component, thereby lowering the power of the write process.

It is another object of the present invention to achieve a further improvement over existing hybrid Hall effect devices by providing devices in which the perpendicular component of magnetic field is increased in the active region of the device, thereby increasing the output voltage (or current).

It is also an object of the present invention to achieve a further improvement over existing hybrid Hall effect devices by providing devices with decreased switching time of the ferromagnetic component layer.

It is also an object of the present invention to achieve a further improvement over existing hybrid Hall effect devices by providing devices with novel materials systems that. have high mobility and produce larger output voltages (or currents).

It is yet another object of the present invention to achieve a further improvement over existing hybrid Hall Effect devices by providing devices incorporating novel materials systems that a re compatible with the fabrication requirements of the support circuitry, such as select, sense and amplification circuits.

These and other objects of the invention are accomplished by providing a Hall effect device comprising:

(a) an electrically-conductive layer or plate having a top surface and capable of carrying an electrical current;

(b) a ferromagnetic multilayer; and (c) where an electrical signal can be generated in response to the fringe magnetic field acting on the electrical current.

In another embodiment, the objects of the present invention are achieved by providing a Hall effect device comprising:

(a) an electrically conductive layer or plate having a top surface; and (b) a ferromagnetic multilayer comprising at least a first magnetic layer and a second magnetic layer.

In yet another embodiment of the present invention, the objects of the present invention are achieved by a Hall effect device comprising:

(a) an electrically-conductive layer or plate having a top surface; and (b) a ferromagnetic layer;

(c) where the electrically conductive layer or plate comprises an indium compound or a germanium compound.

Thus, in one aspect, it has been discovered that certain classes of ferromagnetic materials (e.g., ferrites or perovskite ferromagnetic oxides) can be used for the fabrication of modified Hall effect devices to achieve faster switching times.

In addition, it has been discovered that the ferromagnetic layer can be fabricated as one component of a multilayer (e.g., bilayer), where the second component is a thin magnetic (ferromagnetic or antiferromagnetic) layer for magnetically biasing the first layer. The result of the magnetic bias can be a larger remanence and/or a hysteresis loop that is not symmetric with respect to zero applied field. Other optional layers in the multilayer include, but are not limited to, buffer layer(s) for improving the quality of growth of the ferromagnetic layer and/or bias layer or a passivation layer for protecting the multilayer from environmental degradation.

Furthermore, it has been discovered that a shape anisotropy can be employed to reduce the coercivity, (and therefore reduce the amplitude of current in the write pulse) of the ferromagnetic component, and that an additional element can be used to close flux lines and alter the perpendicular field component in a desirable way. For example, to provide a higher concentration of flux, to prevent stray flux from affecting other parts of the device, and to provide a more perpendicular orientation of the lines of the flux.

Additionally, in considering the class of semiconducting materials used to fabricate the Hall plate, it has been discovered that several different semiconducting materials, with mobilities larger than those of silicon or gallium arsenide, can be used to achieve larger readout voltages (or currents).

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

The basic structure of the modified Hall effect devices of the present invention is described in the previously mentioned U.S. Pat. No. 5,652,445, which is incorporated herein by reference.

Figure 2:
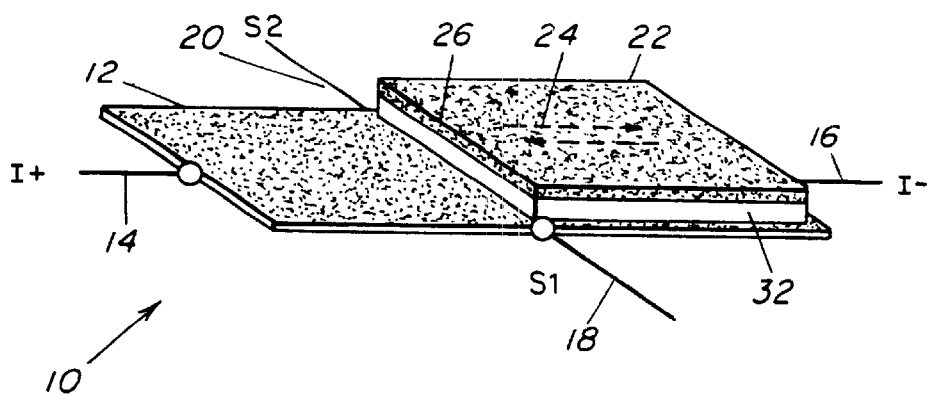
FIG. 2 is a perspective view of a hybrid Hall effect device, a modified Hall plate, according to an embodiment of the present invention.

As discussed above, it has been discovered that novel materials systems enhance device performance. As shown in FIG. 2, a ferromagnetic multilayer (e.g., a film) 22 may, if desired, be electrically isolated from a Hall plate (or layer) 12 by an insulating layer 32 and cover a portion of.the plate so that an edge 26 of the ferromagnetic multilayer is over a region approximately in line with sense probes 18 and 20. The insulating layer 32 may cover the portion of the Hall plate 12 that is directly beneath the ferromagnetic multilayer 22, or may cover all of the Hall plate 12 and may serve the additional function of passivating portions of the device structure and offering protection against degradation during and after processing.

It is possible to fabricate the hybrid Hall effect device so that a ferromagnetic gated FET is provided, where the Hall plate 12 is the conducting channel of an FET and the ferromagnetic layer 22 is fabricated on top of, or as a portion of, the FET gate electrode.

Transition metal ferromagnets, such as PERMALLOY ($Ni_{0.8}Fe_{0.2}$), iron, and cobalt, can be used as the ferromagnetic material in hybrid Hall effect devices. In a first embodiment of the present invention, certain classes of ferromagnetic materials (e.g., ferromagnetic insuldtors) offer enhanced performance of several device characteristics. An example of one category of these materials is the ferrites, which are magnetic oxides containing ferric oxide ($Fe_2O_3$) as their basic magnetic component. If desired, these ferrites may contain dopants such as Mn, Co, Ni, Zn and mixtures thereof. Another example is a category of materials known as the perovskite ferromagnetic oxides, such as strontium ruthenate. Other suitable classes of materials include, but are not limited to ferromagnetic semiconductors and rare-earth transition metal alloys. The ferromagnetic material should be magnetically ordered at the desired operating temperature, have sufficiently high magnetic moment to be useful and have an appropriate coercivity. Metallic magnetic materials have large moments and reasonable coercivities, with switching times typically of order nsec. Some semiconducting magnetic materials have faster switching times, 0.1 nsec or less, but the have smaller values of magnetization. Some insulating magnetic materials have fast switching times, approximately 1 psec, but relatively small magnetizations. Both semiconductors and insulators have poor conductivity and can thereby be used without the addition of an insulating layer. This is an advantage because the magnitude of the fringe field is largest at positions very close to the magnetic layer. When no additional insulating layer is used, the magnetic multilayer can be positioned very close to the Hall plate. The result is that devices fabricated with insulating or semiconducting materials may have output values that are as large as those that use metallic magnetic multilayers, but they may be able to take advantage of the faster switching speed.

Ferrites typically have a spine structure, or a variation of the spinel structure, such that local moments with number $n_A$ in one atomic plane (A) are oriented in one direction and the logical moments with number $n_B$ in the next plane (B) are oriented in the opposite direction. Since the number of moments per plane are not equal, i.e., $n_A \neq n_B$, the material has a net magnetization M. The magnitude of the saturation magnetization $M_s$ of the ferrites as measured by a standard laboratory magnetometer, is typically on the order of about $4 \Pi M_s = 3{,}000$ Oe, which is much less than that of transition metal ferromagnets, e.g. about $4 \Pi M_s = 11{,}000$ Oe for PERMALLOY and about $4 \Pi M_s = 20{,}000$ Oe for iron. Some ferrites have relatively large magnetizations, such as manganese zinc ferrite ($MnZnFe_2O_4$), with approximately $4 \Pi M_s = 4{,}000$ Oe. Other properties of ferrites are similar to those of metallic ferromagnets: like the transition metal ferromagnets, the ferrites have a strong shape anisotropy that confines the magnetization to the plane of a film, they have low values of coercivity (from approximately 1 Oe to about 100 Oe), and they can be fabricated with one or more easy magnetization axes in the film plane.

The local magnetic fields at the edge 26 of the ferromagnetic film or multilayer 22 (refer to FIG. 2) provide the mechanism that enables the Hybrid Hall device to operate. The magnitude :of these fields is proportional to the saturation magnetization $M_s$ of the ferromagnetic film or multilayer 22, and the output of the device is thus proportional to the value of $M_s$. Although the ferrites have lower $M_s$ than metallic magnetic materials, the local magnetic fields may have sufficiently large magnitudes when the distance from the edge 26 to the Hall plate 12 is minimized. The magnitude of the field is diminished as the vertical distance from the edge 26 to the layer 12 is increased.

Hybrid Hall effect devices that incorporate transition metal ferromagnets usually function best when the ferromagnetic layer is electrically isolated from the Hall plate 12 by a thin insulating layer (layer 32 in FIG. 2) of thickness $z_0$. $Z_o$ can vary greatly, from orders less than or about 1 nm to as great as or greater than orders of tens of nm. When the metallic ferromagnetic multilayer 22 is not isolated in this way, a large portion of the bias current is shunted through the metallic ferromagnetic layer and the voltage detected at terminals 18 and 20 is reduced. However, the insulating layer has the effect of placing the carriers in the Hall plate 12 at a greater distance from the edge 26. The local magnetic fields have diminished value at this greater distance, and the output of the device is therefore reduced from the optimum value.

Because magnetic insulators such as the ferrites or perovskites are electrically insulating, a ferromagnetic multilayer 22 comprised of such a material or of a magnetic semiconductor can be fabricated directly on top of the Hall plate 12. The carriers in the Hall plate 12 are now in closer proximity to the edge 26 and the local magnetic fields are relatively large, so that device output is increased. The carriers in the Hall plate 12 are now in closer proximity to the edge 26 and the local magnetic fields are relatively large, so that device output is increased. It follows that a hybrid Hall effect device fabricated with an insulating ferromagnetic material directly on top of the conductive Hall plate may have output levels that are comparable with a device fabricated using a metallic ferromagnetic element and a thin insulating layer.

Magnetic insulators have other properties that offer additional benefits. They are chemically stable, and it is typically not necessary to passivate a ferrite ferromagnetic layer against environmental degradation. Furthermore, the time $T_f$ required to reverse the magnetization of the ferromagnetic multilayer 22 sets a limitation on the speed of some device operations, such as the write operation. The value of $T_f$ is about 1 to about 10 psec for magnetic insulators such as the ferrites, which is about two to three orders of magnitude shorter than the value for transition metal ferromagnets, which have $T_f$ of about 1 nsec. Thus, Hybrid Hall devices fabricated using magnetic insulators for the ferromagnetic multilayer 22 may operate with frequencies as high as about $10^{12}$ Hz (1 THz).

In another aspect of the above-described embodiment, a ferromagnetic multilayer comprised of a magnetic insulator can be fabricated as a portion of the insulating layer between the gate electrode and channel, or can be fabricated on top of said insulating layer.

The above remarks about magnetic insulators apply to all embodiments of the present invention (and also to any modified Hall effect Device, such as MAGFET, magnetotransistor, etc.).

When the ferromagnetic multilayer is a magnetic insulator based on ferrite(s) or perovskite ferromagnetic oxides, the Hall plate can be made from various materials including, but not limited to Si, Ge, GaAs, SiGe, Bi, or compound semiconductor heterostructures.

The thicknesses and the sizes of the various layers making up the devices described in the embodiments described above are not particularly limited. Typically, however, the ferromagnetic multilayer has a thickness of order 10 to 100 nm, and that of the Hall plate is the order of 1 to 10 nm.

In yet another embodiment of the present invention, it has been discovered that one important technique for enhancing the properties of the ferromagnetic multilayer is to fabricate the ferromagnetic multilayer as a portion of a magnetic multilayer (e.g., a bilayer) in which one or more of the other component layers have magnetic properties that influence the properties of the ferromagnetic multilayer. One example of this technique is to fabricate the ferromagnetic multilayer 22 as a magnetic bilayer $F_b$, with two components, $F_1$ and $F_2$ in order to stiffen the anisotropy and enhance the remanence. The component $F_1$ is a magnetic material such as a transition metal ferromagnet or a ferrite, and has a thickness of about 10 nm to 1.0 μm, and has a relatively large saturation magnetization $M_s$ (e.g., about 800 Oe/4 Π to about 1600 Oe/4 Π) so that the fringe magnetic fields generated at edge 26 are relatively large. Typically, the material that comprises $F_1$ is chosen to have a small coercivity $H_c$ from about 1.0 Oe to 100 Oe, as measured on a standard laboratory magnetometer. The component $F_2$ is usually a magnetic material with a thickness of about 1 to about 10 nm, has a small value of saturation magnetization of about <10,000 Oe, can be fabricated beneath $F_1$ or on top of $F_1$, and has magnetic properties that interact with those of $F_1$.

For example, $F_2$ can be an antiferromagnetic insulator such as nickel oxide (NiO) or manganese iron ($Mn_{1-x}Fe_x$, wherein x is approximately 0.5). A bilayer comprised of PERMALLOY for $F_1$ with a thickness of approximately 100 nm and nickel oxide for $F_2$ with a thickness of approximately 2 nm will have the same value of saturation magnetization as a single layer of PERMALLOY. The coercivity will be increased, $H_c$ of about 40 Oe, but the remanence $M_r$ of the bilayer will also be substantially increased to a value comparable with the saturation magnetization, $M_s$. A single, comparable layer of PERMALLOY would have a smaller coercivity, $H_c$ of about 10 Oe, but would also have a smaller remanence, $M_r$ approximately equal to $M_s/5$. The remanant magnetization is a key device parameter because the output voltage is typically detected in the nonpowered state, H=0, which is equivalently the remanent state. Thus, fabricating the ferromagnetic multilayer 22 as a bilayer can enhance device performance by enhancing the remanent magnetization.

Furthermore, the component $F_2$ can be used to alter the magnetic properties of $F_b$ in other ways. For example, a magnetic bias can be induced so. that the hysteresis loop of $F_b$ is offset from zero by a chosen value. This is useful to introduce asymmetries in device characteristics. For example, a write pulse of a given amplitude for one polarity may be required to set one state of the device, whereas a write pulse of a different amplitude for the opposite polarity would be required to reset the device to the original state. More generally, ferromagnetic multilayer 22 can be a multilayer comprised of n layers including the ferromagnetic material $F_1$, one or more bias layers $F_2$, and one or more nonmagnetic layers $N_i$. The nonmagnetic layers are provided as buffer layers in order to enhance the growth, and therefore the characteristics, of the other layers. For example, a thin layer (30 nm thick) of zinc selenide is, in some circumstances, a suitable buffer layer for enhancing the properties of thin iron films, resulting in films with smaller coercivities and larger remanence. As another example, Ag or Cu may be used as a nonmagnetic buffer layer to provide a smooth, nonreactive interface for the. subsequent growth of Fe films, resulting in smaller coercivities and higher remanence. The nonmagnetic layers may also act as passivation layers, protecting one or more of the layers in the multilayer from degradation during or after processing. For example, a thin layer, approximately 5 nm thick, of Cu passivated Fe films and reduces their coercivity.

The above comments about fabricating the ferromagnetic layer as a magnetic bilayer or multilayer apply to all embodiments of the present invention, including the modified Hall effect device and the ferromagnetic gated FET, and apply to layers where the component $F_1$ is any ferromagnetic material.

Figure 1:
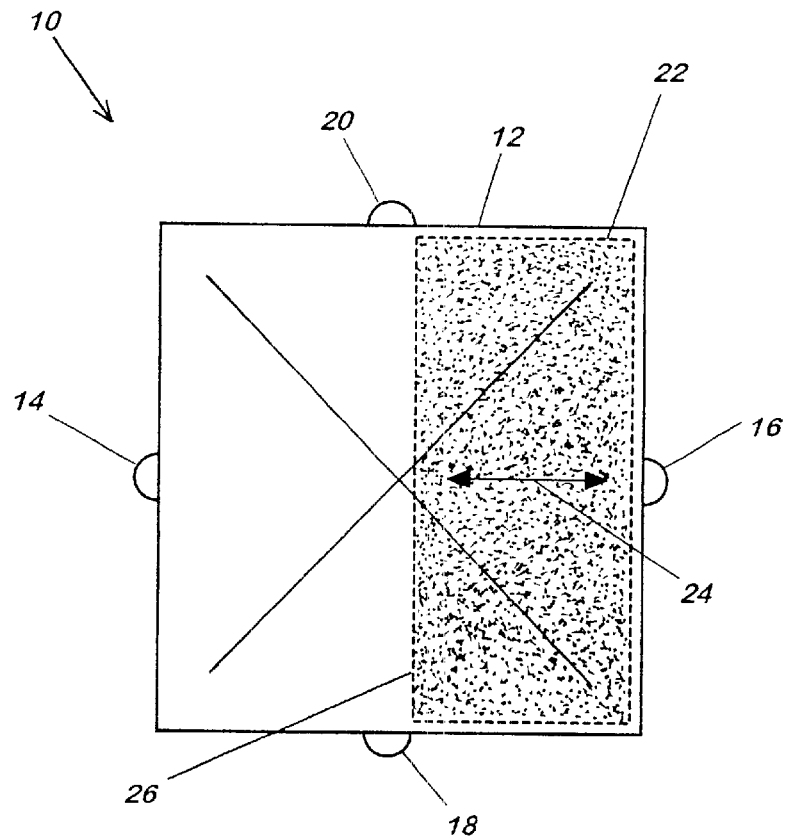
FIG. 1 is a schematic representation of a hybrid Hall effect device, a modified Hall plate, according to an embodiment of the present invention.

Novel Materials for the Hall Plate:

The Hall plate 12 (refer to FIG. 1 and FIG. 2) can be fabricated from any material whose carriers are characterized by a large Hall coefficient such as doped silicon or doped gallium arsenide (semiconductors), or bismuth (a metal). It has been discovered that Hall plates fabricated from several novel material systems afford enhanced device performance.

Thus, in a further embodiment of the present invention, (e.g., 10 in FIG. 1 or FIG. 2), each cell is typically biased by a supply (or bias) voltage $V_B$ from terminal 14 to terminal 16. For constant bias current I+ applied to terminal 14 and grounded as I– at terminal 16, the Hall voltage (or current) sensed between arms S1 (terminal 18) and S2 (terminal 20) has opposite polarity when the fringe fields are "up" compared with when they are "down." The magnetization orientation 24 of the ferromagnetic film 22 is typically in the plane of the ferromagnetic film and lies along an axis parallel with that of the bias current, but it is also possible to use a magnetic material with magnetization perpendicular to the plane. The voltage response of a Hall plate with aspect ratio of approximately unity (ratio of length to width) and with optimally placed sensor probes 18 and 20 (placed approximately in the center of the plate 12) is as follows:

$$V_H = (0.7) \mu V_B B_\perp$$

where $\mu$ is the mobility in units of $(m^2/V\text{-s})$ and $V_H$ is in volts. For the hybrid Hall effect device, $B_{av}$ is substituted for $B_\perp$ (in tesla). A lithographic asymmetry in the placement of the probes 18 and 20 can be introduced to change the output from symmetrically bipolar, $V_{out} = \pm V_H$, to unipolar, e.g. $V_{out} = 0, 2V_H$. This kind of biased output is well suited to accommodate a sense amplifier that discriminates between zero and a positive readout voltage $V_r$. For such a device, the output voltage magnitude is twice the Hall voltage and the voltage to be sensed is:

$$V_r = (1.4) \mu V_B B_{av}$$

The mobility of the Hall material is the only factor that relates the readout voltage directly to the bias voltage. For purposes of this disclosure, the sensed value $V_r$ is discussed in the context of the readout voltage of a memory cell, but the sensed value may also represent the contents of a cell that is being used in a logic operation or information processing environment. Furthermore, it is understood to those skilled in the art that the readout signal $V_r$ may eventually be sensed either as a voltage or a current.

The energy dissipation $E_j$ during a read process, $E_j = V_B^2/R$, where R is the resistance of the element (the resistance from terminal 14 to 16), is determined by R and therefore by the amount of doping n of the Hall plate material and its thickness d. A second consideration also determines the value of the thickness d: the magnitude $B_{av}$ decays with increasing distance r from the ferromagnetic layer, having the functional form $B_{av} \propto 1/r$. Apart from other considerations, the thickness should be minimized in order to minimize the decay of $B_{av}$. Values of d of about 100 nm or less are typical.

In general, power losses are minimized for low values of bias voltage and $V_B$ values of about 1 V are considered desirable. Sense amplifiers for commercial DRAM typically are capable of reliable discrimination between V=0 and $V=V_r=20$ mV, and the desired readout level of DRAM is designed to be $V_r \geq 100$ mV to allow for signal degradation and cross-talk. These values are adopted as guides for calculations made herein. However, there are a variety of sense amplifier circuits and it is clear to those skilled in the art that a modification in the parameters of a sense amplifier will alter the values of the parameters of a Hybrid Hall Effect element. In particular, the present invention is expected to provide superior signal to noise ratio (SNR) and minimal cross-talk, and it is plausible that the sense amplifier may require readout voltage values as low as 10 mV.

The indium compounds and germanium listed below have been found to possess good characteristics. These materials enhance device performance of the improved Hall plate when used as the material system to fabricate the Hall plate 12. It is particularly important to use materials with optimum properties as device dimensions shrink, and it is likely that hybrid Hall effect devices will be fabricated on a submicron scale.

Indium Antimonide (InSb):

Indium Antimonide (InSb) has the largest mobility of commercial semiconductor materials, $\mu = 8$ $m^2/V\text{-s}$, and presently has industrial use in applications where conventional Hall plates are used to sense an external magnetic field. When used in the fabrication of a modified Hall plate (with typical width of sense probes 18 and 20 of 1 micron, and a ferromagnetic film whose edge generates an average field of magnitude $B_{av}$=500 Oe=0.05 tesla), a bias source of 1 Volt gives a sense voltage $V_r$=0.56 V, a value much larger than the sense amplifier requires. Accordingly, InSb is an excellent material choice, and a bias voltage as low as 180 mV will provide an adequate sense voltage $V_r$=100 mV. The doping profile and layer thickness of the InSb film can be chosen for a given environment, and it is well known that the mobility of thin films (thickness approximately 100 nm) is diminished from the bulk value and is highly sensitive to the conditions of growth. For example, use of an appropriate buffer layer can result in a value of mobility that is close to the bulk value. Even without intentional doping, a 100 nm thick film has a resistance of about 300 Ω per square, an appropriate value. Films with thicknesses in the range of about 20 to about 200 nm will have excellent properties. Indium antimonide has such a large Hall efect that it can be used in applications where a current output at terminals 18 and 20 is desired.

Indium Arsenide (InAs):

Indium Arsenide (InAs) has a large mobility, $\mu$=3.3 m$^2$/V-s. When used in the fabrication of a modified Hall plate (with typical characteristics as given above), a bias source of 1 Volt gives a sense voltage $V_r$=0.23 V, a value much larger than the sense amplifier requires. A bias voltage as low as 440 mV will provide an adequate sense voltage $V_r$=100 mV. The mobility of thin indium arsenide films is sensitive to the growth conditions and can vary by an order of magnitude. For example, a film of InAs with thickness about 15 nm grown on a gallium arsenide substrate with a thick intervening buffer layer of aluminum antimonide (AlSb) has a mobility approximately equal to the bulk value when capped by a thin layer (about 15 nm) of AlSb. This structure may have a final passivation coating of InAs or GaSb with thickness about 2 nm. Such a buried InAs layer has a resistance per square of about 150 Ω, an appropriate value. In general, InAs films have high mobilities when grown on an appropriate buffer layer and when capped with an appropriate insulating layer. Such films, with thicknesses in the range of about 10 to about 100 nm, will have excellent properties and will be well suited for use in the modified Hall plate of the present invention.

Thus, InAs is another excellent material choice, and the Hall effect is sufficiently large that it can be used in applications where current output is desired. Furthermore, the circuitry associated with supporting the improved Hall devices, such as address selection and sense amplification, can be fabricated using GaAs FET technology.

Germanium (Ge):

Germanium (Ge) is inexpensive, can be fabricated as a thin film on silicon, typically using a thin buffer layer of SiGe alloy at the interface, and has a higher mobility than silicon, $\mu$=0.39 m$^2$/V-s. It is widely available and can be readily microfabricated. When used in the fabrication of a modified Hall plate (with typical characteristics as given above), a bias source of 1 Volt gives a sense voltage $V_r$=27 mV, a value adequate for many environments. A bias voltage of 3.7 V results in a sense voltage $V_r$=100 mV. The doping profile and layer thickness can be chosen for a given environment. A further advantage of using Ge films is that silicon technology can be used for fabrication of the support circuitry.

A related materials system is a modulation doped Si/Ge heterostructure. These layers typically have mobility of $\mu$=0.2 m$^2$/V-s, somewhat higher than Si.

Indium Phosphide (InP):

Doped InP layers grown on insulating Indium phosphide wafers have a mobility of about $\mu$=1.0 m$^2$/V-s. When used in the fabrication of a modified Hall plate (with typical characteristics as given above), a bias source of 1 Volt gives a sense voltage $V_r$=0.08 V, an adequate value for the sense amplifier. A further advantage to the use of InP based heterostructures is that the support circuitry can be made using InP FET technology, a well developed technology for high speed circuits.

Design Parameters for the Ferromagnetic Element:

Flux Closure:

The local, magnetic fringe field at the edge of the ferromagnetic element generates the voltage (or current) signal that enables operation of the hybrid Hall effect device,. and is also the source.of the demagnetizing field. As the size of the element shrinks, the demagnetizing field magnitude increases and the coercivity of the element becomes.larger. It has been discovered that the stray field lines can be directed down towards the layer of carriers by using a high permeability magnetic element that facilitates closure of the magnetic flux. In this way, the demagnetizing field is reduced, the coercivity is minimized, magnetic interference between neighboring cells is also minimized, and the magnetic flux that acts on the carriers is increased.

Figure 3:
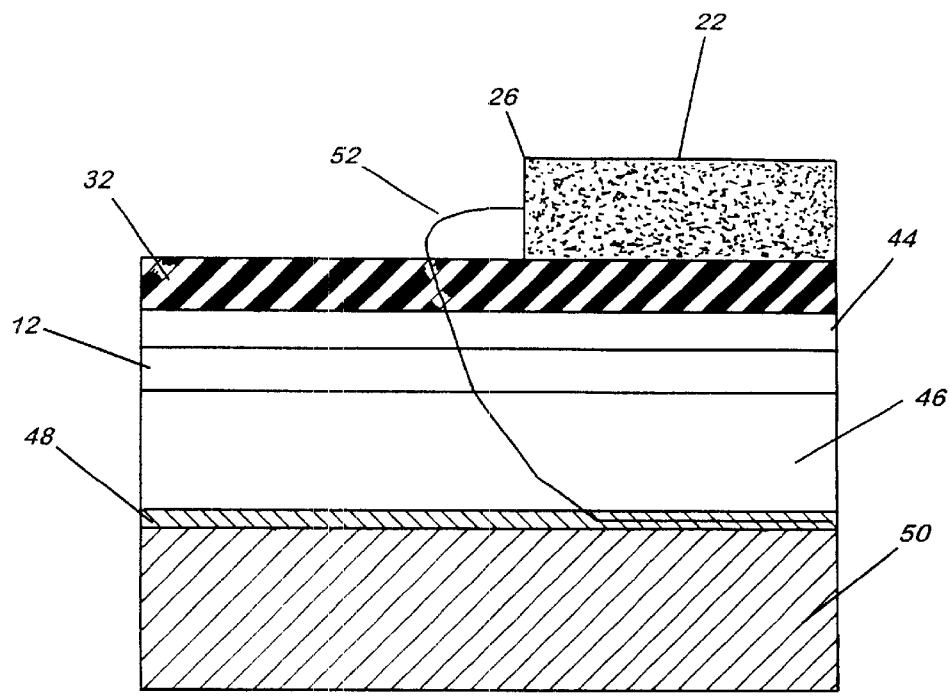
FIG. 3 is a cross sectional view of a portion of a hybrid Hall effect device, a modified Hall plate, according to an embodiment of the present invention, showing an element with high magnetic permeability that can be used to facilitate magnetic flux return and increase the perpendicular component of magnetic field in the active region of the device.

In FIG. 3, a material with high magnetic permeability is deposited as a layer 48 under (or in) the buffer layer 46. An example of a suitable material is PERMALLOY, such as $Ni_{0.8}Fe_{0.2}$. Other examples include, but are not limited to, mu-metal; alloys of Ni, Co, and Fe; alloys of FeCo; and soft magnetic oxides. A magnetic field line 52 originating at the edge 26 of ferromagnetic multilayer 22 is drawn downwards to the high permeability material 48, and the field line closes to the opposite end of the ferromagnetic layer (not pictured). The magnitude of the perpendicular component of field at the plane of the Hall carrier layer 12 is increased, thereby increasing $B_{av}$.

Ideally, for an application involving an array of devices the flux closure material 48 would be individually patterned and aligned beneath each ferromagnetic layer. The magnetic state of the ferromagnetic layer would be set by fringe fields from write pulses applied to an integrated write wire, and coupling to the closure element 48 would be so weak that the write process would not be affected. In some environments, it may be possible to fabricate the flux closure layer 48 as a continuous layer. The material will break into domains, with a domain associated with each ferromagnetic layer in the array, and walls at the edges of these domains may generate fringe fields that could degrade performance.

Figure 4:
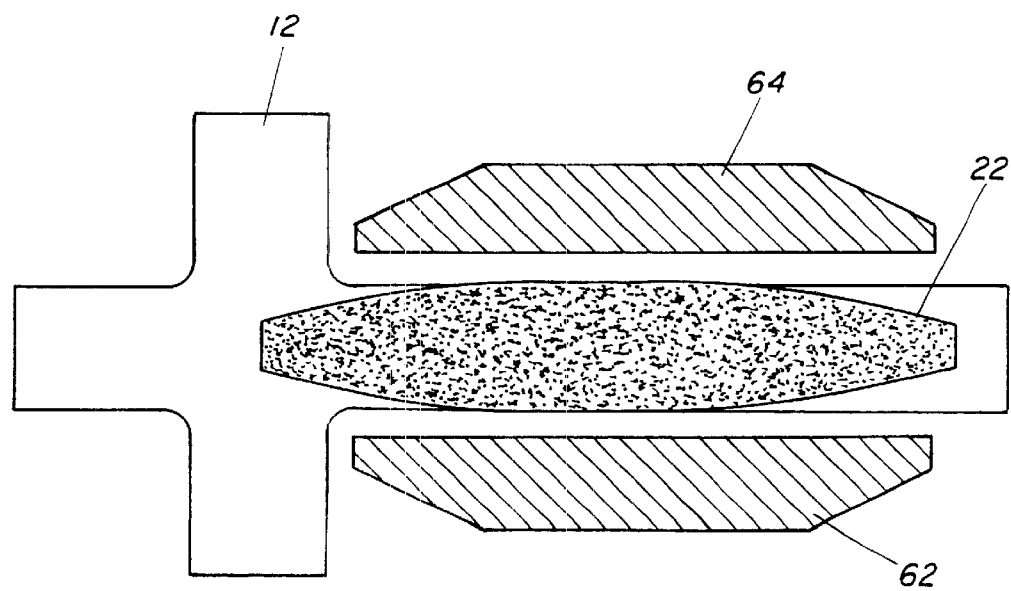
FIG. 4 is a top view of a hybrid Hall effect device, a modified Hall plate, according to an embodiment of the present invention, showing a ferromagnetic component with a preferred shape anisotropy and two lateral elements of high magnetic permeability used to facilitate magnetic flux return.
Figure 5:
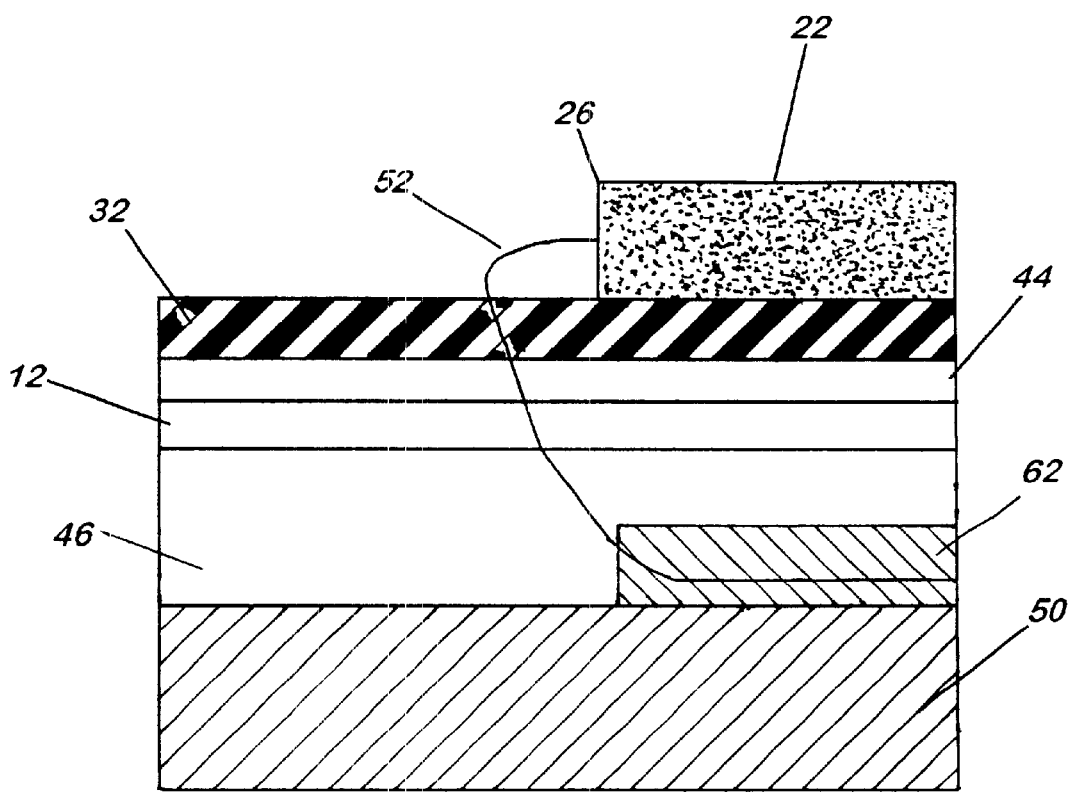
FIG. 5 is a cross sectional view of a portion of a hybrid Hall effect device, a modified Hall plate, according to an embodiment of the present invention, showing a portion of a lateral element of high magnetic permeability used to facilitate magnetic flux return.

In some materials systems it may not be possible to find an appropriate material that can be grown under (or as a part of) the buffer layer 46. However, it is still possible to provide a magnetic element for flux closure. FIG. 4 depicts a Hall carrier layer 12 with ferromagnetic element 22. One or more ferromagnetic components 62 (and/or 64) can be fabricated in close proximity, to the side of ferromagnetic multilayer 22. In the cross sectional view of FIG. 5, the Hall cross has been patterned using a mesa etch that etches through the insulating layers 32 and 44, the Hall carrier layer 12, and the buffer layer 46, to the surface of the substrate 50. In practice, the mesa step might etch only a small distance past the interface between the Hall carrier layer 12 and the buffer layer 46. The flux closure element 62 (and/or 64) is then microfabricated such that it is substantially beneath the level of the Hall carrier laver 12. In this case, an appropriate material for the flux closure element 62 (and/or 64) is PERMALLOY, e.g. $Ni_{0.8}Fe_{0.2}$. Field lines (such as line 52)

from the edge 26 of ferromagnetic multilayer 22 are drawn down towards the closure element 62 (and/or 64). The magnitude of the perpendicular component of field at the plane of the Hall carrier layer 12 is increased, thereby increasing $B_{av}$. Using this kind of fabrication, it would be beneficial to planarize the device prior to fabrication of the write wires. Also, the use of a flux closure element permits fabrication of a vertical cell, where trenches are etched in the semiconductor substrate and the magnetic elements are fabricated with their long axes perpendicular to the substrate plane.

Shape Anisotropy:

A variety of magnetic anisotropies can be used to influence the magnetic characteristics of the ferromagnetic multilayer. An important design criteria involves shape anisotropy. It has been discovered that a long rectangle, with an aspect ratio of about 5 to 1, promotes formation of an easy magnetization axis along the long axis of the rectangle resulting in low coercivity and high remanence. It has been discovered that an ellipse, with a similar aspect ratio of about 4 to 1, results in slightly lower coercivities than a rectangle.

FIG. 4 depicts a top view of a Hall plate 12 with ferromagnetic element 22. Prototype cells appropriate for Very Large Scale Integration (VLSI) have been fabricated with PERMALLOY and cobalt films with dimensions approximately 1 μm by 5 μm. Prototype cells appropriate for Ultra Large Scale Integration (ULSI) have been fabricated with PERMALLOY films with dimensions approximately 0.5 μm by 2.5 μm. The ferromagnetic film 22 in FIG. 4 has been drawn with a shape approximating an ellipse. As device dimensions shrink, square edges are rounded and fabrication favors the ellipse. A ULSI prototype with a PERMALLOY film has achieved a coercivity of 25 Oe with a very high remanence.

What is claimed is:

1. An improved Hall effect device comprising:
   a conductive film layer having a top surface and capable of carrying an electrical current;
   a ferromagnetic multilayer having a configurable magnetization orientation, and covering a first portion of the top surface, and not a second portion, such that a fringe magnetic field substantially normal to such surface can be generated by an edge portion of the ferromagnetic layer;
   wherein an electrical signal can be generated in response to the fringe magnetic field acting on the electrical current in the conductive film layer; and
   wherein the ferromagnetic multilayer comprises at least a first magnetic layer and a second magnetic layer.

2. The device of claim 1, wherein said ferromagnetic multilayer comprises a material selected from the group consisting of ferromagnetic metals, ferromagnetic insulators, magnetic insulators, rare earths, and transition metals.

3. The device of claim 1, wherein said first ferromagnetic layer has a saturation magnetization that is larger than that of said second magnetic layer.

4. The device of claim 1, wherein said second magnetic layer is an antiferromagnetic layer.

5. The device of claim 4, wherein said antiferromagnetic layer is NiO or $Mn_{1-x}Fe_x$, where x is about 0.5.

6. The device of claim 1, wherein said first magnetic layer has a coercivity of about 1 Oe to about 10 Oe.

7. The device of claim 1, wherein said magnetic multilayer further comprises at least one nonmagnetic layer.

8. The device of claim 1, wherein said ferromagnetic multilayer has a top surface in an isotropic shape.

9. The device of claim 8, wherein said isotropic shape is an ellipse or a rectangle with an aspect ratio of at least about 3;
   wherein said aspect ratio is defined as the ratio of the length to the width.

10. The device of claim 2, wherein said magnetic insulator is selected from the group consisting of ferrites and perovskite ferromagnetic oxides.

11. The device of claim 1, further including a first sensor coupled to a first edge of said conductive film layer.

12. The device of claim 1, further including a first sensor coupled to a first edge of said conductive film layer, and a second sensor coupled to a second edge of the conductive film layer, opposite to the first edge, such that the electrical signal is a voltage generated substantially along an axis joining the first and second sensors.

13. The device of claim 1, further including an insulating layer disposed between said electrically-conductive layer and said ferromagnetic multilayer.

14. The device of claim 1, wherein said device is a field effect transistor (FET) in which said electrically-conductive layer is a conducting channel.

15. The device of claim 2, wherein said magnetic insulator is a magnetic oxide containing $FeO$, $Fe_2O_3$, $Fe_3O_4$, and mixtures thereof.

16. The device of claim 2, wherein said magnetic insulator has a coercivity of up to about 100 Oe.

17. The device of claim 1, further including a buffer layer;
   wherein said buffer layer is in contact with said ferromagnetic multilayer.

18. The device of claim 1, wherein said ferromagnetic multilayer has a top surface in an anisotropic shape.

19. The device of claim 18, wherein said anisotropic shape is an ellipse or a rectangle with an aspect ratio of at least about 3;
   wherein said aspect ratio is defined as the ratio of the length to the width.

20. The device of claim 1, further including a write line for configuring the magnetization orientation in the ferromagnetic layer.

21. The device of claim 1, wherein the ferromagnetic multilayer is coupled to a magnetic field generated by magnetically recorded data, the electrical signal generated is related to a value of the data, and the device operates as a magnetic field sensor.

22. The device of claim 12, wherein the ferromagnetic multilayer has an easy magnetization axis that is substantially parallel to the electrical current and substantially perpendicular to the axis joining the first and second sensors.

23. A memory device comprising:
   a conductive film layer having a top surface;
   a ferromagnetic multilayer having at least two configurable and stable magnetization orientation states corresponding to two different values of a data item stored in said device, and covering a portion of the top surface such that a fringe magnetic field having two states and configured substantially normal to the top surface can be generated by an edge portion of the ferromagnetic layer;
   wherein two different electrical signals, each corresponding to a different one of the two different data values, can be generated in response to the two fringe magnetization field states acting on an electrical current flowing in the conductive film layer; and
   wherein the ferromagnetic multilayer comprises at least a first magnetic layer and a second magnetic layer.

24. The device of claim 23, further including a first sensor coupled to a first edge of the conductive film layer, and a second sensor coupled to a second edge of the conductive film layer, opposite to the first edge, such that the two different electrical signals are voltages generated substantially along an axis joining the first and second sensors.

25. The device of claim 24, wherein the two electrical signals comprise a first voltage output signal when a first value of the data item is stored in said device, and a second voltage output value when a second value of the data item is stored in said device.

26. A logic device for implementing a logic function relating a combination of one or more input signals to an output signal comprising:

a conductive film layer having a top surface;

a ferromagnetic multilayer having at least two stable magnetization orientation states and covering a portion of the top surface such that a fringe magnetic field can be generated substantially normal to the top surface by an edge portion of the ferromagnetic layer; and a write line for inductively coupling! the ferromagnetic layer with a magnetic field generated by said input data signals on the wire, the input data signals having one of a first and a second current value, an electrical output signal generated in response to the fringe magnetic field acting on an electrical current flowing in the conductive film layer, and wherein the electrical output signal relates to said input signals and to said logic function; and wherein the ferromagnetic multilayer comprises at least a first magnetic layer and a second magnetic layer.

27. The device of claim 26, wherein the electrical output signal has a first value when the ferromagnetic multilayer magnetization orientation state is altered by magnetic fields corresponding to a first combination of said input data signals related to said logic function, and the electrical ouput signal has a second value when the ferromagnetic multilayer magnetization state is not altered by magnetic fields corresponding to a second combination of said input data signals.

28. The device of claim 26, wherein the magnetization orientation state of the ferromagnetic multilayer corresponds to a result of said logic function implemented in said device, and this result is stored in said device until the magnetization orientation state is altered by a subsequent combination of input signals.

29. The device of claim 28, wherein the magnetization state of the ferromagnetic layer can be set initially based on the logical function to be implemented by said device.

30. An electronic device comprising:

a field effect transistor (FET), including a source region, a drain region, a gate and a channel;

a ferromagnetic multi layer having a configurable magnetization orientation, and positioned relative to the gate and channel such that a fringe magnetic field directed substantially normal to the channel can be generated by an edge portion of the ferromagnetic multilayer;

wherein an electrical signal related to the magnetization orientation of the ferromagnetic multilayer can be generated in response to the fringe magnetic field acting on an electrical current flowing between the source and drain of the FET; and wherein the ferromagnetic multilayer comprises at least a first magnetic layer and a second magnetic layer.

31. The device of claim 30, wherein the electrical current flows between a first bias terminal coupled to the source of the FET and a second bias terminal coupled to the drain of the FET.

32. A memory device comprising:

a field effect transistor (FET), including a source, a drain, a gate and a channel;

a ferromagnetic multilayer having at least two configurable and stable magnetization orientation states corresponding to two different values of a data item stored in said device, and positioned relative to the gate and channel such that a fringe magnetic field directed substantially normal to the channel can be generated by an edge portion of the ferromagnetic multilayer;

wherein two different output electrical signals corresponding to the two different data values can be generated in response to the fringe magnetization field acting on an electrical current flowing in the channel; and wherein the ferromagnetic multilayer comprises at least a first magnetic layer and a second magnetic layer.

* * * * *